United States Patent
Lee

(10) Patent No.: US 9,147,619 B2
(45) Date of Patent: Sep. 29, 2015

(54) ORGANIC LIGHT-EMITTING DISPLAY PANEL

(71) Applicant: Samsung Display Co., Ltd., Yongin, Gyeonggi-Do (KR)

(72) Inventor: Hyun Lee, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/176,589

(22) Filed: Feb. 10, 2014

(65) Prior Publication Data

US 2015/0090961 A1 Apr. 2, 2015

(30) Foreign Application Priority Data

Oct. 2, 2013 (KR) .................. 10-2013-0118127

(51) Int. Cl.
| H01L 51/00 | (2006.01) |
| H01L 21/66 | (2006.01) |
| G09G 3/00 | (2006.01) |
| H01L 51/52 | (2006.01) |

(52) U.S. Cl.
CPC ............. *H01L 22/30* (2013.01); *G09G 3/006* (2013.01); *H01L 51/52* (2013.01); *H01L 2251/10* (2013.01)

(58) Field of Classification Search
CPC ........... H01L 51/0545; H01L 51/0036; H01L 51/0541; H01L 51/5012
USPC .......................................................... 257/40
See application file for complete search history.

(56) References Cited

U.S. PATENT DOCUMENTS

| 7,301,360 | B2 * | 11/2007 | Kim et al. ................ 324/760.01 |
| 8,736,519 | B2 * | 5/2014 | Byun et al. ....................... 345/76 |
| 2013/0141314 | A1 | 6/2013 | Ka et al. |
| 2014/0354286 | A1 | 12/2014 | Kim |

FOREIGN PATENT DOCUMENTS

| KR | 1020040061951 A | 7/2004 |
| KR | 1020070110745 A | 11/2007 |
| KR | 1020110032328 A | 3/2011 |
| KR | 10-2014-0141375 A | 12/2014 |

\* cited by examiner

*Primary Examiner* — Quoc Hoang
(74) *Attorney, Agent, or Firm* — Robert E. Bushnell, Esq.

(57) ABSTRACT

An organic light-emitting display panel includes a pixel unit including a plurality of pixels respectively located at intersections between scan lines and data lines and displaying different colors; a plurality of pads respectively coupled to ends of the data lines; and a test unit selectively performing an array test to detect a defect of a pixel circuit of the pixels or a cell test to detect a defect of a light-emitting device of the pixels.

20 Claims, 10 Drawing Sheets

ORGANIC LIGHT-EMITTING DISPLAY PANEL

CLAIM OF PRIORITY

This application claims priority under 35 U.S.C. §119 of Korean Patent Application No. 10-2013-0118127, filed on Oct. 2, 2013, in the Korean Intellectual Property Office, the disclosure of which is incorporated herein in its entirety by reference.

BACKGROUND OF THE INVENTION

1. Field of the Invention

Embodiments of the present invention generally relate to an organic light-emitting display panel, and more particularly, to an organic light-emitting display panel capable of performing a defect test.

2. Description of the Related Art

Organic light-emitting display apparatuses display images by using organic light-emitting diodes that are self-emission devices. As the luminescence and color purity of such apparatuses are excellent, they have received attention as the next generation display apparatuses.

In the case of typical organic light-emitting display apparatuses, high-density integrated circuits including driving circuits that generate and apply scan signals and data signals to pixels are manufactured and coupled to array substrates on which pixels are arranged by using tape automated bonding (TAB) techniques. However, an organic light-emitting display apparatus in which a driving circuit is coupled to a pixel array substrate by using a TAB technique needs a plurality of leads for coupling the pixel array substrate to the driving circuit, and thus, the manufacturing process thereof is difficult and the reliability and yield of the manufacturing process is low. Also, since the price of a high-density integrated circuit is generally high, the price of the organic light-emitting display apparatus increases.

In order to overcome such limitations, a chip-on-glass (COG) or system-on-panel (SOP) type organic light-emitting display apparatus has been used. This apparatus is manufactured by directly integrating a driving circuit into a pixel circuit array substrate in which a pixel circuit is arranged. As such, the COG or SOP type organic light-emitting display apparatus does not require a separate process to couple the driving pixel to the pixel circuit array substrate, and accordingly, it is possible to increase the reliability and yield of the manufacturing process.

SUMMARY OF THE INVENTION

One or more embodiments of the present invention include an organic light-emitting display panel that that allows early detection of a defect in a pixel unit after an array process is performed and includes a reduced dead space.

Additional aspects will be set forth in part in the description which follows and, in part, will be apparent from the description, or may be learned by practice of the presented embodiments.

According to one or more embodiments of the present invention, an organic light-emitting display panel includes a pixel unit including a plurality of first, second, and third pixels, each pixel located at intersections of scan lines and data lines and including a light-emitting device and a pixel circuit coupled to said light-emitting device, a plurality of data pads respectively coupled to ends of the data lines, and a test unit, which is coupled to the pixel unit via the plurality of data pads, selectively performing an array test to detect a defect of the pixel circuits of the pixels or a cell test to detect a defect of the light-emitting devices of the pixels.

The pixel unit may include a first column in which the first pixels and the second pixels may be alternately arranged, a second column and a fourth column, in which the third pixels may be arranged, and a third column, in which the first pixels and the second pixels may be alternately arranged in an opposite order to the first column. The second column may be interposed between the first column and the fourth column, and the third column may be interposed between the second column and the fourth column.

The test unit may include an array test pad externally receiving array test signals, delivering the signals to the pixel unit, and receiving test currents output from the pixel unit, and a signal distribution unit arranged between the data pads and the array test pad. The signal distribution unit may include a first switch positioned in a first current path and a second switch positioned in a second current path that are coupled to a first data line arranged in the first column, a fourth switch positioned in a third current path and a fifth switch positioned in a fourth current path that are coupled to a third data line arranged in the third column, a third switch coupled to a second data line arranged in the second column, and a sixth switch coupled to a fourth data line arranged in the fourth column. The first and second current paths may be connected in parallel, and the third and fourth current paths may be connected in parallel. The test unit may further include a test selection unit, which includes a seventh switch that is positioned in the second current path and an eighth switch that is positioned in the third current path, and a cell test unit including a ninth switch delivering a cell test signal to the pixel unit.

The array test pad may be interposed between the ninth switch and the test selection unit.

During the array test, the ninth switch may maintain a turned-off state, the seventh switch may be turned-off, blocking a current passing through the second current path, and the eighth switch may be turned-off, blocking a current passing through the third current path, and the first and fourth switches, the second and fifth switches, the third switch, and the sixth switch may be turned off in a determined order and deliver the array test signal to the pixel unit.

During the cell test, the ninth switch may maintain a turned-on state, if the seventh and eighth switches are turned off, the first switch may be electrically coupled to the first data line arranged in the first column and the fifth switch may be electrically coupled to the third data line arranged in the third column, and the first switch and the fifth switch may be turned on in a determined order and delivers first and second cell test signals to the pixel unit, and if the seventh and eighth switches are turned on, the third switch and the sixth switch may be simultaneously turned on and deliver a third cell test signal to the pixel unit.

The test selection unit may further include a plurality of switches that may be arranged among the first, third, fifth, and sixth switches, and that couple the first, third, fifth, and sixth switches to the array test pad.

The ninth switch may be formed of a plurality of sub-switches each coupled to one of the first through sixth switches and deliver one of the first to the third cell test signals to the pixel unit.

During the array test, the plurality of sub-switches may maintain a turned-off state, the seventh and eighth switches may be turned off, blocking a current flowing through any of the second and third current paths, the plurality of switches of the test selection unit that are arranged among the first, third, fifth, and sixth switches may be turned on and couple the first, third, fifth, and sixth switches to the array test pad, and the first, third, fifth, and sixth switches may be turned on in a determined order and deliver the array test signal to the pixel unit.

During the cell test, the plurality of sub-switches may maintain a turned-on state, the seventh and eighth switches may be turned on, and electrically couple both the first switch and the second switch to the first data line arranged in the first column and electrically couple both the fourth switch and the fifth switch to the third data line arranged in the third column, the plurality of switches of the test selection unit that are arranged among the first, third, fifth, and sixth switches are turned off, the first through sixth switches may be coupled to the ninth switch, and the first and fourth switches, the second and fifth switches, the third switch, and the sixth switch may be turned on in a determined order and deliver the first to the third cell test signals to the pixel unit.

The first to the third cell test signals may be direct-current signals.

Alternatively, the pixel unit may include a first column on which the first pixels may be arranged, a third column in which the third pixels may be arranged, and a second column, in which the second pixels may be arranged, interposed between the first and second columns.

The test unit may include an array test pad externally receiving an array test signal, delivering the signal to the pixel unit, and receiving a test current output from the pixel unit, a signal distribution unit arranged between the data pads and the array test pads and comprising first through third switches each coupled to a data line arranged in each of the first through third columns, and a cell test unit comprising a fourth switch delivering a cell test signal to the pixel unit.

The array test pad may be disposed between the fourth switch and the signal distribution unit.

During the array test, the fourth switch may maintain a turned-off state, and the first through third switches may be turned on in a determined order and deliver the array test signal to the pixel unit.

During the cell test, the fourth switch may maintain a turned-on state, and the first through third switches may be turned on in a determined order and deliver first to third cell test signals to the pixel unit.

The organic light-emitting display panel may further include a test selection unit that comprises fifth switches arranged among the first through third switches and coupling the first through third switches to the array test pad.

The fourth switch may include a plurality of sub-switches each coupled to one of the first through third switches and delivering one of the first to the third cell test signals to the pixel unit.

During the array test, the plurality of sub-switches may maintain a turned-off state, the fifth switches may be turned on and couple the first through third switches to the array test pad, and the first through third switches may be turned on in a determined order and deliver the array test signal to the pixel unit.

During the cell test, the plurality of sub-switches may maintain a turned-on state, the fifth switches may be turned off, and the first switch to the third switch may be turned on in a determined order and deliver the first to the third cell test signals to the pixel unit.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
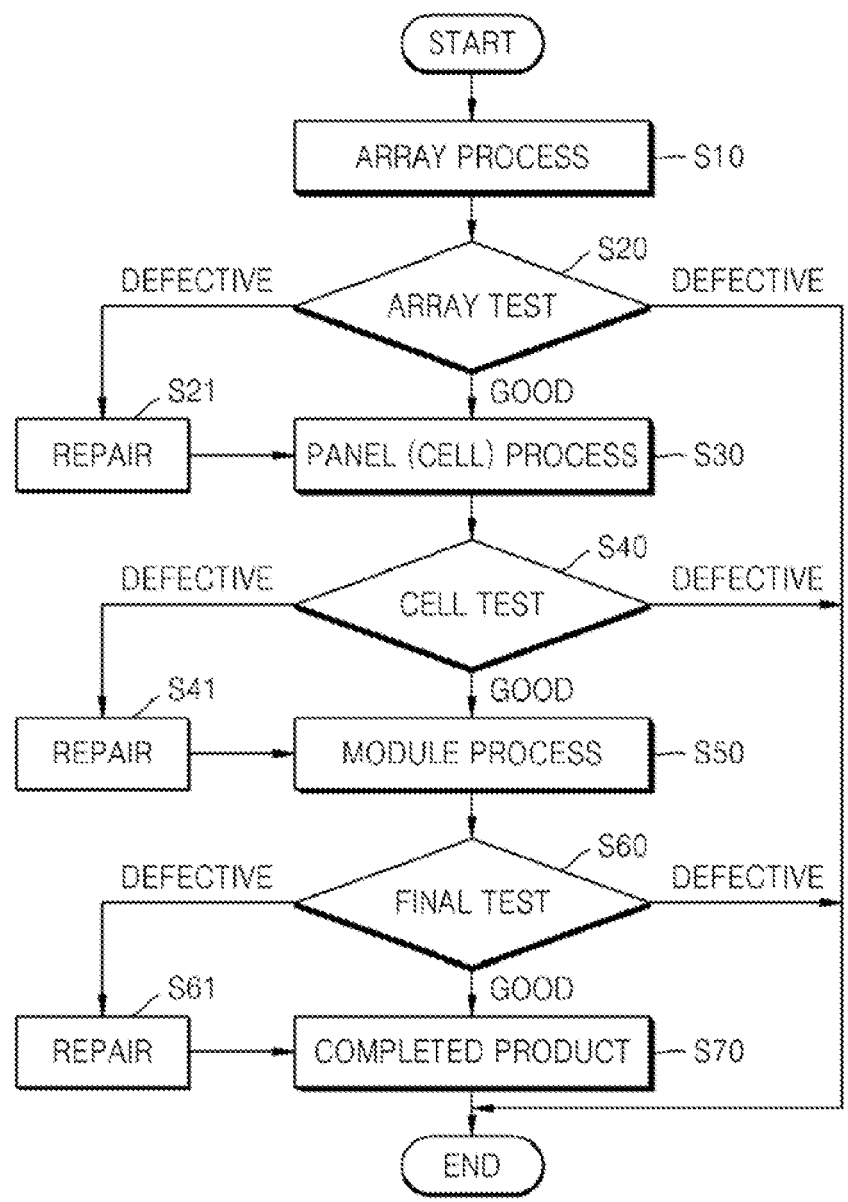
FIG. 1 is a flow chart of a method of manufacturing an organic light-emitting display apparatus according to an embodiment of the present invention.

Particular embodiments of the present invention will be illustrated in the drawings and described in the detailed description in detail. The effects and features of the present invention and implementation methods thereof will be clarified through the following embodiments described with reference to the accompanying drawings. The present invention may, however, be embodied in different forms and should not be construed as limited to the embodiments set forth herein.

In the accompanying drawings, the same or similar components are denoted by the same reference numerals and thus descriptions thereof are not repetitively provided.

The terms "first" and "second" as used herein do not have limited meanings and only distinguish a component from another component. Terms in the singular form may include the plural form unless the contrary is specifically described.

In the following embodiments, the term "includes" and "has" mean that all features or components described in the specification exist, but do not exclude the possibility of adding one or more features or components. As used herein, the term "and/or" includes any and all combinations of one or more of the associated listed items FIG. 1 is a flow chart of a method of manufacturing an organic light-emitting display apparatus according to an embodiment of the present invention.

An array process S10 is performed to form a pixel circuit array on a substrate. The pixel circuit array includes a plurality of pixel circuits and each pixel circuit may include two or more thin film transistors and one or more capacitors. Subsequently, an array test S20 is performed to detect whether the pixel circuit array is defective. In the array test S20, it is tested whether the pixel circuit operates normally. If the array test S20 determines that the pixel circuit has reparable defects, the defective pixel circuit undergoes a repair process S21. If the array test S20 determines that the pixel circuit has irreparable defects, no further operation is performed with the defective pixel circuit.

A cell (panel) process S30 is performed with a pixel circuit array which is determined as being good in the array test S20 or which is repaired in the repair process S21. An anode electrode, an organic light-emitting layer, and a cathode electrode are formed on the substrate to complete an organic light-emitting diode (OLED) in the cell (Panel) process S40, thereby forming a panel. After the cell (panel) process S30, a cell test S40 including a panel lighting test, a leakage current test, and/or an aging test may be performed with the panel. Likewise, if the cell test S40 determines that the panel has reparable defects, the defective panel undergoes a repair process S41. If the cell test S40 determines that the panel has irreparable defects, no further operation is performed with the defective panel.

A final test S60 is performed after a module process S50 performed on a panel which is determined as a being good product in cell test S40 or which is repaired in the repair process S41, and thus a completed product is obtained and a defect is identified. If the final test S60 determines that a module has reparable defects, the defective module undergoes a repair process S61. If the final test S60 determines that the module has irreparable defects, no further operation is performed with the defective module.

In the embodiment of the present invention, since defects of the thin film transistors are identified after the array process S10, it is possible to increase a manufacturing yield by pre-repairing the defective pixel circuit array. Also, since the cell (panel) process and the module process are not performed on a defective pixel circuit array that may not be repaired, it is possible to decrease the manufacturing time and cost.

Figure 2:
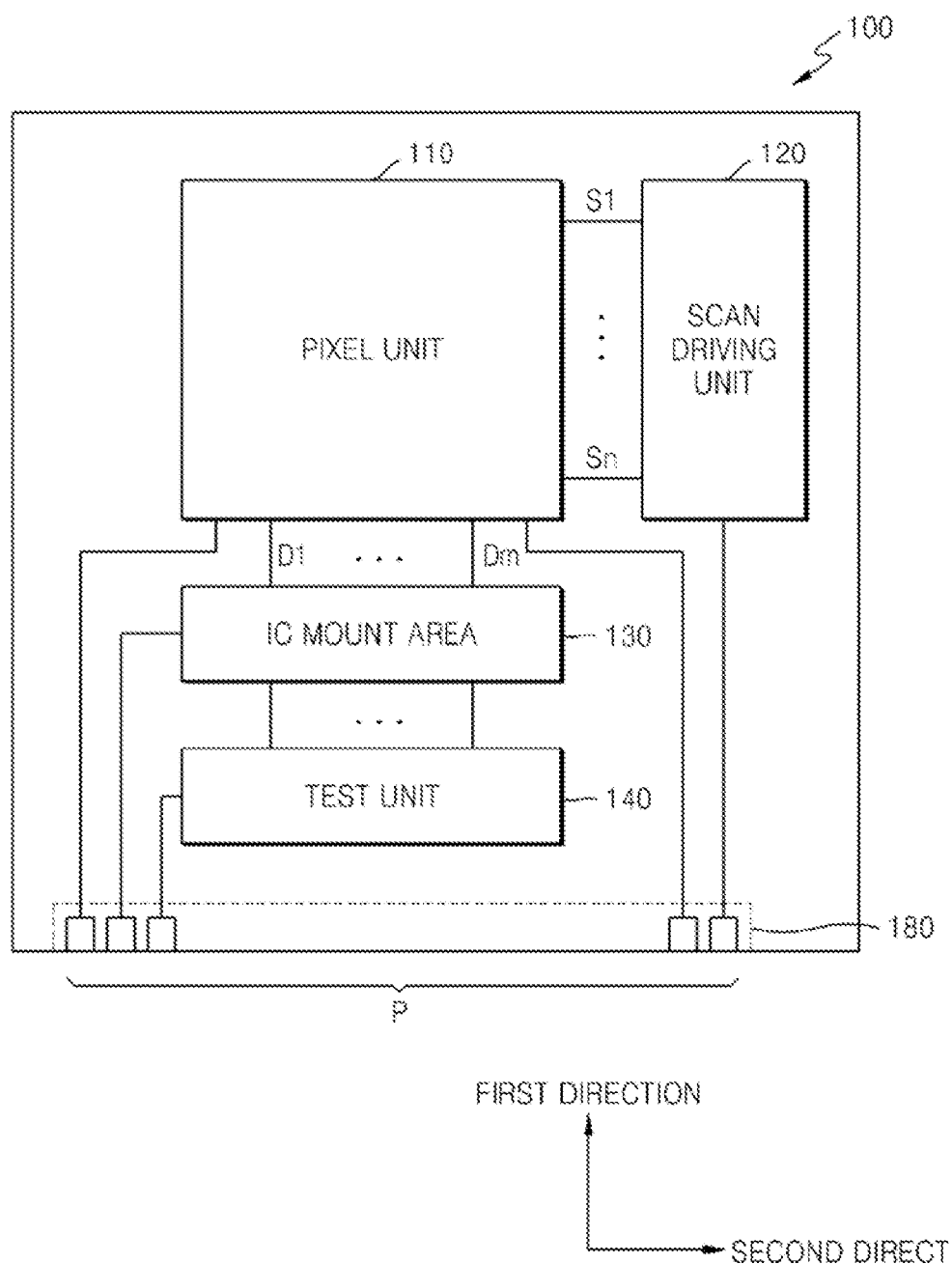
FIG. 2 is a schematic plan view of an organic light-emitting display panel according to an embodiment of the present invention.

FIG. 2 is a schematic plan view of an organic light-emitting display panel according to an embodiment of the present invention.

Referring to FIG. 2, an organic light-emitting display panel 100 according to an embodiment of the present invention includes a pixel unit 110, a scan driving unit 120, an IC mount area 130, a test unit 140, and a pad unit 180.

The pixel unit 110 includes a plurality of pixels that are located at the intersection of data lines D1 through Dm and scan lines S1 through Sn and emit light of different colors. The data lines D1 through Dm are extended in a first direction and the scan lines S1 through Sn are extended in a second direction.

The scan driving unit 120 generates a scan signal in response to a scan driving voltage VDD or VSS externally supplied and a scan control signal SCS, and sequentially supplies the generated scan signal to the scan lines S1 through Sn.

A plurality of data pads (not shown in FIG. 2) respectively coupled to wirings extended from the data lines D1 through Dm of the pixel unit 110 are arranged on the IC mount area 130. A data driving unit (not shown) is bonded to the data pads in a COG scheme and mounted on the IC mount area 130. The data driving unit generates a data signal in response to display data DATA and a data control signal DCS and supplies the generated data signal to the data lines D1 through Dm.

The test unit 140 performs an array test to determine whether a capacitor and a thin film transistor forming a pixel circuit of a pixel are defective. The test unit 140 receives an array test signal and a control signal and supplies the array test signal to the data lines D1 through Dm in response to the control signal. The test unit 140 may be coupled to probe pins of an external auto probe device and receive the array test signal.

Also, the test unit 140 performs a cell test to determine whether a light-emitting device of a pixel is defective. The test unit 140 receives a cell test signal and a control signal and supplies a cell test signal to the data lines D1 through Dm in response to the control signal.

The test unit 140 may selectively perform an array test and a cell test according to a plurality of control signals.

The pad unit 180 includes a plurality of pads P for delivering an externally-supplied voltage and/or signals to the inside of the panel 100. In FIG. 2, the location and number of lines coupling the pad unit 180 to components in the panel 100 are provided as an example and a plurality of lines may be arranged at other locations. For example, lines supplying a signal from the pad unit 180 to the scan driving unit 120 may include five lines that receive the scan driving voltage VDD/VSS, a start pulse SP as a scan control signal SCS, a scan clock signal CLK and an output enable signal OE.

On the other hand, the organic light-emitting display panel 100 according to an embodiment of the present invention may include a light-emitting control unit for applying a light-emitting control signal to the pixel unit 110 so that sufficient test signals are applied to pixels in the cell test S40, though not shown.

Figure 3:
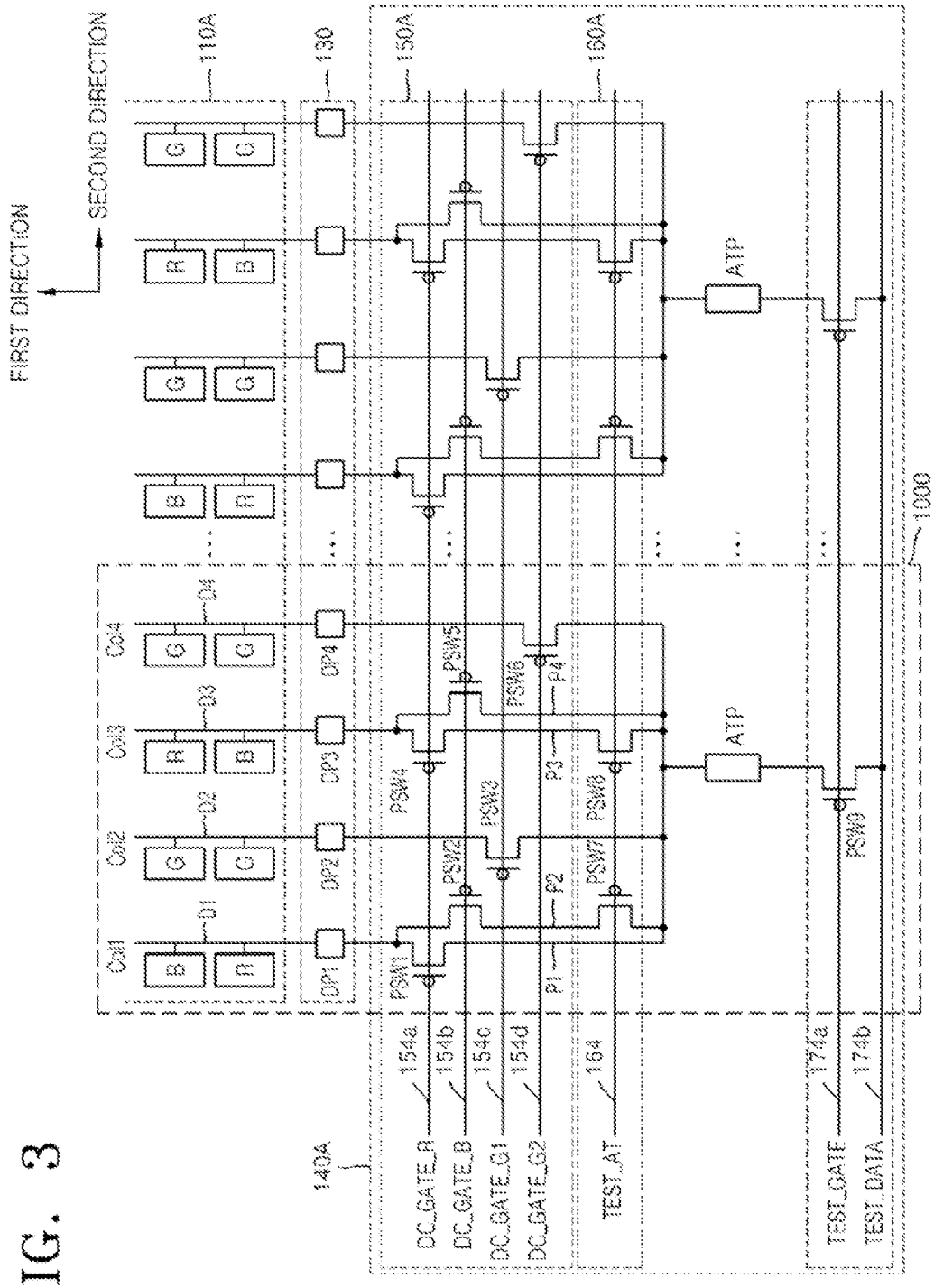
FIG. 3 is a plan view of an example of the organic light-emitting display panel of FIG. 2.

FIG. 3 is a plan view of an example of the organic light-emitting display panel of FIG. 2.

Referring to FIG. 3, a pixel unit 110A includes first pixels, second pixels, and third pixels that emit light of different colors and has a structure in which the first pixel and the second pixel are alternately arranged in the same column and the third pixels are arranged in a column adjacent to a column in which the first pixel and the second pixel are linearly arranged. For example, a first column Col1 and a third column Col3 each may include the first pixels and second pixels alternately arranged. Each of a second column Col2 positioned between the first column Col1 and the third column Col3, and a fourth column Col4 positioned adjacent to the third column Col3 and opposite to the second column Col2 with respect to the third column Col3, may include the third pixels.

The first pixel is a red pixel R emitting a red light, the second pixel is a blue pixel B emitting a blue light, and the third pixel is a green pixel G emitting a green light.

The red pixel R and the blue pixel B are alternately arranged in the same column, and the green pixels G are arranged in a column adjacent to a column on which the red pixel R and the blue pixel B are linearly arranged.

In this case, the red pixels R and the blue pixels B are arranged so that the red pixels R and the blue pixels B respectively are face each other in a diagonal direction with the green pixels G disposed therebetween. That is, the red pixels G and the blue pixels G are arranged in a checkboard-pattern. In other words, the red pixels G and the blue pixels B are alternately arranged so that the red pixel R or the blue pixel B is not repetitively arranged in the same column of two neighboring rows. The data lines D1 through Dm are arranged in each column.

Although it is described in the embodiment of the present invention that the pixel unit 110A includes the red pixel R, the blue pixel B, and the green pixel G, the pixel unit 110A may further include pixels (not shown) for displaying other colors than the red color, the green color, and the blue color.

A test unit 140A may include array test pads ATP, a signal distribution unit 150A and a test selection unit 160A between array test pads ATP and data pads DP of the IC mount area 130, and a cell test unit 170A.

Lines supplying signals from the pad unit 180 to the signal distribution unit 150A may include four lines 154a to 154d that receive first to fourth control signals DC_GATE_R, DC_GATE_B, DC_GATE_G1, DC_GATE_G2.

The signal distribution unit 150A includes a plurality of switches coupled between a plurality of data pads and a plurality of array test pads. For the convenience of explanation, only the components within a sector 1000 are numbered in FIG. 3 and discussed here.

As shown in the sector 1000 of FIG. 3, the signal distribution unit 150A may couple a plurality of data pads DP1 through DP4 to one array test pad ATP through the first through sixth switches PSW1 through PSW6. Thus, by using fewer array test pads than data pads, it is possible to increase the size of the array test pads and the interval between the array test pads. Since in the embodiment of FIG. 3, four data pads DP1 through DP4 are coupled to one array test pad ATP, it is possible to decrease the number of the array test pads to ¼ times the number of data pads. Although not shown in FIG. 3, according to other embodiments of the present invention, each two, three, five, or more data pads may be coupled to one array test pad in order to decrease the number of array test pads and/or increase the size of the array test pads.

As shown in the sector 1000 of FIG. 3, a first switch PSW1 and a second switch PSW2 are coupled through a first data pad DP1 to a first data line D1 of the first column Col1 in which the first pixels and second pixels are alternately arranged. The first switch PSW1 is arranged in a first path P1, and the second switch PSW2 is arranged in a second path P2 which is connected parallel to the first path P1. A third switch PSW3 is coupled through a second data pads DP2 to a second data line D2 of the second column Col2 in which third pixels are arranged. A fourth switch PSW4 and a fifth switch PSW5 are coupled through a third data pad DP3 to a third data line D3 of the third column Col3 in which the first pixels and second pixels are alternately arranged in opposite order to the first column Col1. The fourth switch PSW4 is arranged in a third path P3, and the fifth switch PSW5 is arranged in a fourth path P4 which is connected parallel to the third path P3. A sixth switch PSW6 is coupled through a fourth data pad DP4 to a fourth data line D4 of the fourth column Col4 in which third pixels are arranged.

The first switch PSW1 and the second switch PSW2 are coupled to the first data line D1 along which the first pixel and the second pixel are alternately arranged. The third switch PSW3 is coupled to the second data line D2 of the second column Col2 which is close to the first column and in which the third pixels are linearly arranged. The fourth switch PSW4 and the fifth switch PSW5 are coupled to the third data line D3 of the third column Col3 which is close to the second column Col2 and in which the first pixel and the second pixel are alternately arranged in an opposite order to the first column Col1. The sixth switch PSW6 is coupled to the fourth data line D4 of the fourth column Col4 which is close to the third column Col3 and in which the third pixels are linearly arranged. As shown in FIG. 3, the pixels of the first column Col1 through fourth column Col4, the data pads DP1 through DP4 that correspond to the first column Col1 through fourth column Col4, the switches PSW1 through PSW6 of the signal distribution unit 150A that correspond to the first column Col1 through fourth column Col4, are repetitively arranged in the second direction.

As shown in the sector 1000 of FIG. 3, the gates of the first switch PSW1 and the fourth switch PSW4 are coupled to a line 154a supplying a first control signal DC_GATE_R. The gates of the second switch PSW2 and the fifth switch PSW5 are coupled to a line 154b supplying a second control signal DC_GATE_B. The gate of the third switch PSW3 is coupled to a line 154c supplying a third control signal DC_GATE_G1. The gate of the sixth switch PSW6 is coupled to a line 154d supplying a fourth control signal DC_GATE_G2.

The first to the fourth control signal lines 154a to 154d receive direct current type control signals DC_GATE_R, DC_GATE_B, DC_GATE_G1, and DC_GATE_G2 respectively from the pad unit 180 while the array test S20 and the cell test S40 are performed, and control the turning on and the turning off of the first to the fourth switches PSW1 through PSW6. As shown in FIG. 3, the first to the fourth control signal lines 154a to 154d extend along the second direction and connected to the gates of the respective switches of the signal distribution unit 150A.

A line supplying a signal from the pad unit 180 to the test selection unit 160A may include a line 164 receiving a fifth control signal TEST_AT.

The test selection unit 160A includes a plurality of switches. For the convenience of explanations, only the switches of the test selection unit 160A within the sector 1000 are numbered in FIG. 3 and discussed here. As shown in the sector 1000 of FIG. 3, the gates of switches PSW7 and PSW8 are coupled to the line 164 supplying the fifth control signal TEST_AT. A seventh switch PSW7 is disposed in one of the first and second paths P1 and P2. An eighth switch PSW8 is disposed in one of the third and fourth paths P3 and P4. For example, the seventh switch PSW7 may be disposed in the same path P2 as the second switch PSW2 and coupled to the first data line D1 via the second switch PSW2, and thus, the second path P2 including the second and seventh switches PSW2 and PSW7 is connected parallel to the first path P1 including the first switch PSW1. The eighth switch PSW8 may be disposed in the same path P3 as the fourth switch PSW4 and coupled to the third data line D3 via the fourth switch PSW4, and thus, the third path P2 including the fourth and eighth switches PSW4 and PSW8 is connected parallel to the fourth path P4 including the fifth switch PSW5. If the seventh and eighth switches PSW7 and PSW8 are turned on by the fifth control signal TEST_AT, both the first and second switches PSW1 and PSW2 may be coupled to the first data line D1, and both the fourth and fifth switches PSW4 and PSW5 may be coupled to the third data line D3. If the seventh and eighth switches PSW7 and PSW8 are turned off by the fifth control signal TEST_AT, the switch PSW1 is coupled to the first data line D1 and the fifth switch PSW5 is coupled to the third data line D3. That is, the seventh switch PSW7 enables one or both of the first and second switches PSW1 and PSW2 corresponding to the first column Col1 to be coupled to the first data line D1 along which the first pixel and the second pixel are alternately arranged, and the eighth switch PSW8 enables one or both of the fourth and fifth switches PSW4 and PSW5 corresponding to the third column Col3 to be coupled to the third data line D3 along which the first pixel and the second pixel are alternately arranged. As shown in FIG. 3, the seventh and eighth switches PSW7 and PSW8 are repetitively arranged in the second direction.

The present invention is not limited to the arrangement shown in FIG. 3. According to another embodiment (not shown in FIG. 3) of the present invention, the seventh switch PSW7 may be disposed in the same path P1 as the first switch PSW1 and coupled to the first data line D1 via the first switch PSW1, and the eighth switch PSW8 may be disposed in the same path P4 as the fifth switch PSW5 and coupled to the fourth data line D4 via the fifth switch PSW5.

An array test pad is in contact with (coupled to) a probe pin of an auto probe device. Since a data pad is small in size and the interval between two adjacent data pads is narrow, the data pad may not make 1:1 contact with the probe pin of the auto probe device. On the contrary, according to the embodiment of the present invention which uses a plurality of switches, for example, the first through eighth switches PSW1 through PSW8 of the signal distribution unit 150A and test selection unit 160A within the sector 1000, the array test pad thus may have a large size and interval. That is, since the array test pad ATP may make 1:1 contact with the probe pin of the auto probe device, it is possible to perform the array test S20. The array test pad receives an array test signal from the probe pin of the auto probe device, delivers the signal to the pixel unit 110A, and receives a test current output from the pixel unit 110A.

A line supplying a signal from the pad unit 180 to the cell test unit 170A may include two lines that are a line 174a receiving a sixth control signal TEST_GATE, and a line 174b receiving a cell test signal TEST_DATA. The cell test unit 170A includes a plurality of switches. For example, a ninth switch PSW9 within the sector 1000 is one of the plurality switches of the cell test unit 170A. The gate of the ninth switch PSW9 is coupled to the line 174a supplying the sixth control signal TEST_GATE. The first terminal of the sixth switch PSW6 is coupled to the array test pad ATP and the second terminal thereof is coupled to the line 174b supplying the cell test signal TEST_DATA. The ninth switch PSW9 receives the sixth control signal TEST_GATE used for maintaining a turned-off state during the array test S20 and maintains the turned-off state in response thereto. The ninth switch PSW9 receives the sixth control signal TEST_GATE used for maintaining a turned-on state during the cell test S40 and maintains the turned-on state in response thereto. First to third cell test signals are sequentially applied to the cell test signal line 174b.

Figure 4:
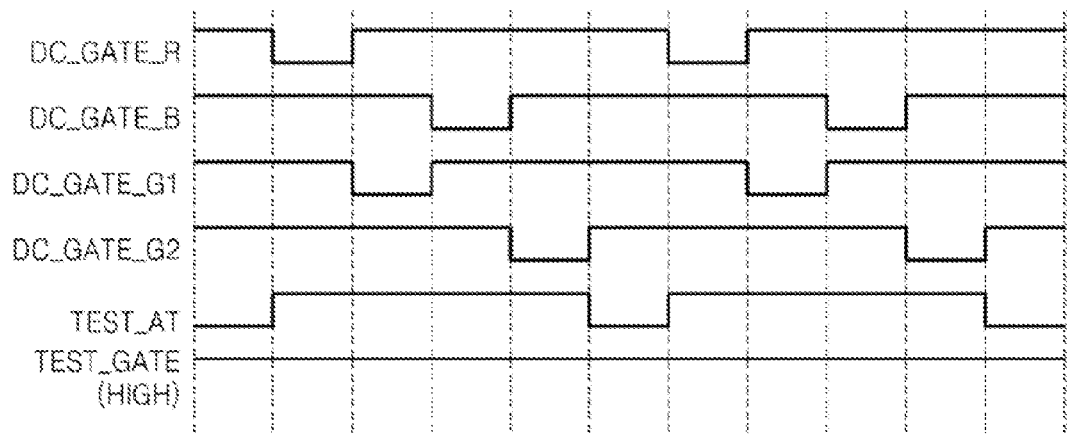
FIG. 4 is a timing diagram for explaining an array test for the organic light-emitting display panel of FIG. 3.

FIG. 4 is a timing diagram for explaining the array test for the organic light-emitting display panel of FIG. 3.

Referring to FIG. 4, during the array test S20, a high-level sixth control signal TEST_GATE is applied to the gates of the plurality of switches of the cell test unit 170A, and thus, the plurality of switches of the cell test unit 170A are turned off.

A high-level fifth control signal TEST_AT is applied to the gates of the switches of the test selection unit 160A, and thus, the switches of the test selection unit 160A are turned off. Thus, one of the first switch PSW1 and the second switch PSW2 is electrically coupled to the first data line D1 of the first column Col1 in which the first pixel and the second pixel are alternately arranged and one of the fourth switch PSW4 and the fifth switch PSW5 is electrically coupled to the third data line D3 of the third column Col3 in which the first pixel and the second pixel are alternately arranged. For example, as shown in FIG. 3, the first switch PSW1 is electrically coupled to the first data line D1 and no current (or negligible current) passes through the second path P2, the third switch PSW3 is electrically coupled to the second data line, the fifth switch PSW5 is electrically coupled to the third data line D3 and no current (or negligible current) passes through the third path P3, and the sixth switch PSW6 is electrically coupled to the fourth data line D4, when a high-level fifth control signal TEST_AT is applied to the gate of the seventh and eighth switches PSW7 and PSW8 of the test selection unit 160A.

While the seventh and eighth switches PSW7 and PSW8 are in a turned-off state, the first to the fourth control signals DC_GATE_R to DC_GATE_G2 are supplied in a determined order, so that the first to the fourth switches PSW1 to PSW6 are turned on in a determined order in response thereto. For example, the first control signal DC_GATE_R, the third control signal DC_GATE_G1, the second control signal DC_GATE_B, and the fourth control signal DC_GATE_G2 are sequentially applied and the first switch PSW1, the third switch PSW3, the fifth switch PSW5, and the sixth switch PSW6 are sequentially turned on in response thereto.

Thus, an array test signal supplied to the array test pad ATP through the probe pin of the auto probe device is supplied to the pixel unit 110A and a test current is output from the pixel unit 110A in response to the applied array test signal. The auto probe device may detect a defective pixel by sensing the test current from the array test pad ATP.

Figure 5:
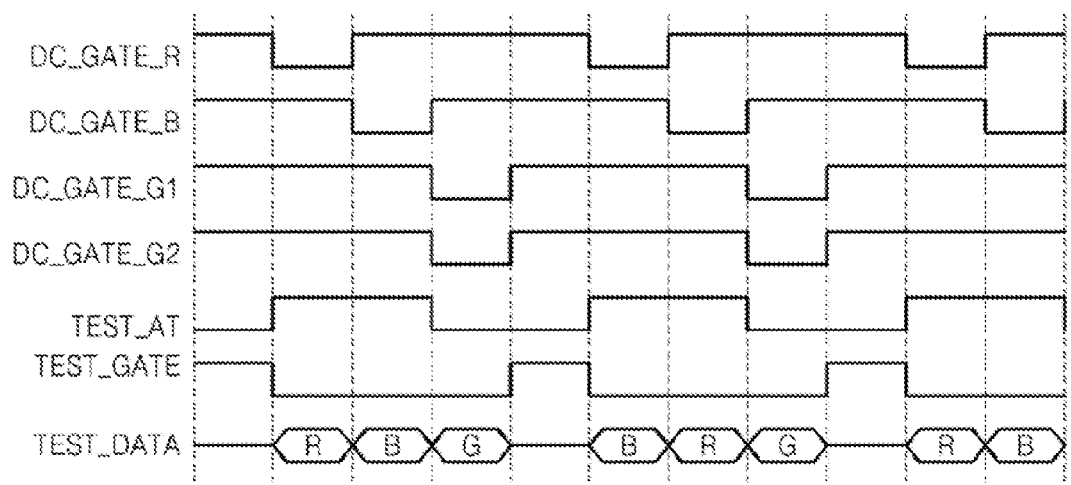
FIG. 5 is a timing diagram for explaining a cell test for the organic light-emitting display panel of FIG. 3.

FIG. 5 is a timing diagram for explaining the cell test for the organic light-emitting display panel of FIG. 3.

Referring to FIG. 5, during the cell test S40, a low-level sixth control signal TEST_GATE is applied to the gates of the switches of the cell test unit 170A, and thus, the switches of the cell test unit 170A are turned on. The cell test signal TEST_DATA is applied in the order of a first cell test signal TEST_DATA_R, a second cell test signal TEST_DATA_B, and a third cell test signal TEST_DATA_G at odd frames, and is applied in the order of the second cell test signal TEST_DATA_B, the first cell test signal TEST_DATA_R, and the third cell test signal TEST_DATA_G at even frames.

While the first cell test signal TEST_DATA_R and the second cell test signal TEST_DATA_B are sequentially applied to the cell test signal line 174b, a high-level fifth control signal TEST_AT is applied to the gates of the switches of the test selection unit 160A, and thus, the switches of the test selection unit 160A are turned off. Thus, one of the first switch PSW1 and the second switch PSW2 is electrically coupled to the first data line D1 of the first column Col1 in which the first pixel and the second pixel are alternately arranged and one of the fourth switch PSW4 and the fifth switch PSW5 is electrically coupled to the third data line D3 of the third column Col3 in which the first pixel and the second pixel are alternately arranged. Thus, one of the switches of the test selection unit 160A is electrically coupled to each data line. For example, as shown in FIG. 3, the first switch PSW1 is electrically coupled to the first data line D1 and no current (or negligible current) passes through the second path P2, the third switch PSW3 is electrically coupled to the second data line, the fifth switch PSW5 is electrically coupled to the third data line D3 and no current (or negligible current) passes through the third path P3, and the sixth switch PSW6 is electrically coupled to the fourth data line D4, when a high-level fifth control signal TEST_AT is applied to the gate of the seventh and eighth switches PSW7 and PSW8 of the test selection unit 160A.

While the third cell test signal TEST_DATA_G is applied to the cell test signal line 174b, a low-level fifth control signal TEST_AT is applied to the gates of the switches of the test selection unit 160A and turns on the switches of the test selection unit 160A.

During odd frames, while the switches of the test selection unit 160A are in a turned-off state, the first control signal DC_GATE_R and the second DC_GATE_B are sequentially applied and thus the first switch PSW1 and the fifth switch PSW5 are sequentially turned on. Thus, the first cell test signal TEST_DATA_R is applied to the first data line D1 of the first column Col1 on which the first pixel and the second pixel are alternately arranged, and subsequently the second cell test signal TEST_DATA_B is applied to the third data line D3 of the third column Col3. In addition, while the switches of the test selection unit 160A are in a turned-on state, the third control signal DC_GATE_G1 and the fourth control signal DC_GATE_G2 are simultaneously applied, and thus, the third switch PSW3 and the sixth switch PSW6 are simultaneously turned on. That is, the third cell test signal TEST_DATA_G is simultaneously applied to the second and the fourth data lines D2 and D4 of the second column Col2 and the fourth column Col4 on which the third pixels are arranged.

During even frames, while the switches of the test selection unit 160A are in a turned-off state, the first control signal DC_GATE_R and the second control signal DC_GATE_B are sequentially applied and thus the first switch PSW1 and the fifth switch PSW5 are sequentially turned on. Thus, the second cell test signal TEST_DATA_B is applied to the first data line D1 of the first column Col1 in which the first pixel and the second pixel are alternately arranged, and subsequently the first cell test signal TEST_DATA_R is applied to the third data line D3 of the third column Col3. In addition, while the switches of the test selection unit 160A are in a turned-on state, the third control signal DC_GATE_G1 and the fourth control signal DC_GATE_G2 are simultaneously applied and thus the third switch PSW3 and the sixth switch PSW6 are simultaneously turned on. Thus, the third cell test signal TEST_DATA_G is simultaneously applied to the second and the fourth data lines D2 and D4 of the second column Col2 and the fourth column Col4 in which the third pixels are arranged.

Thus, the first to the third pixels of the pixel unit 110A emit light by using the first to the third cell test signals TEST_DATA_R, TEST_DATA_B, and TEST_DATA_G so that the cell test, such as a lighting test, may be performed.

Figure 6:
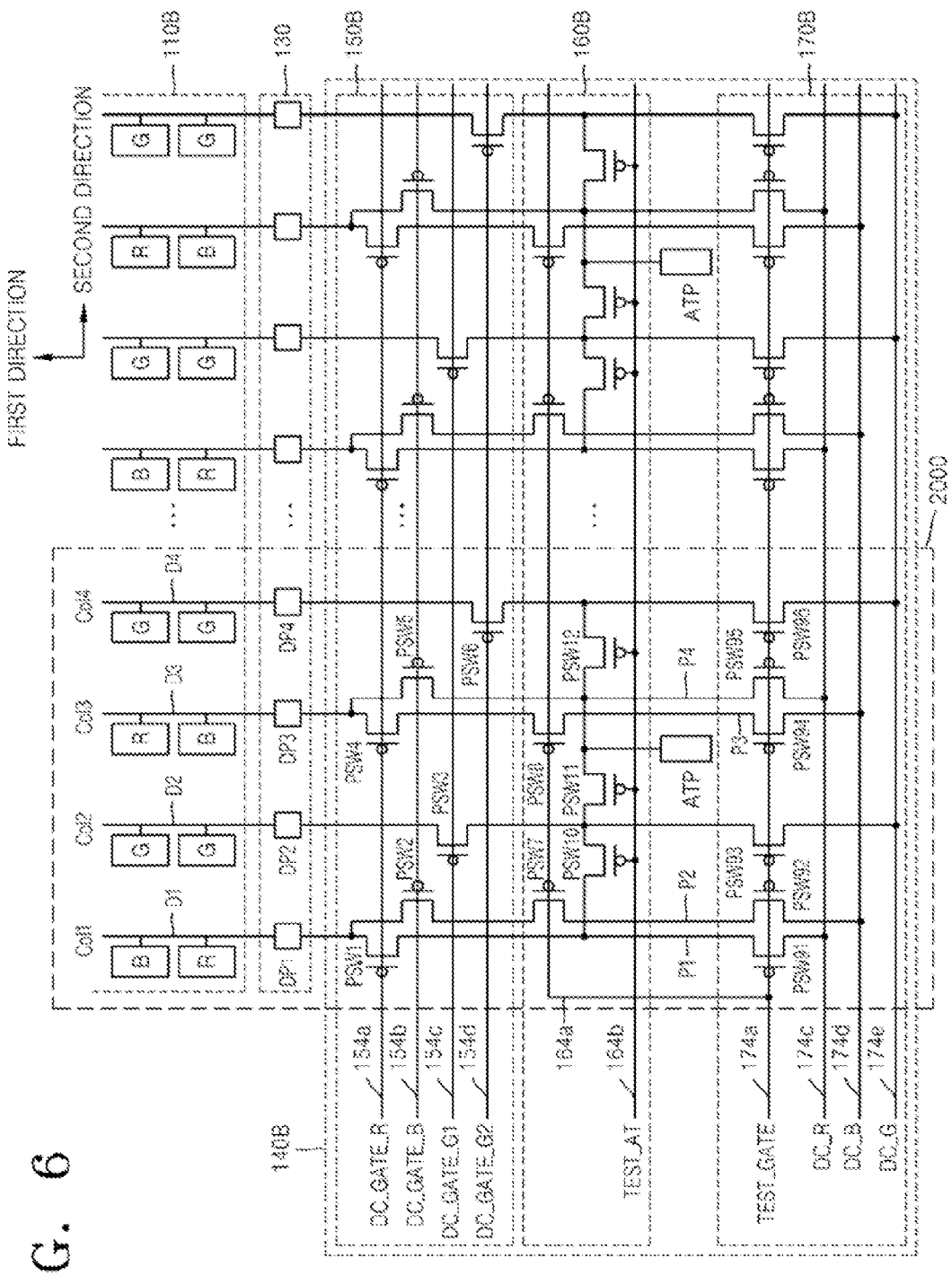
FIG. 6 is an example of the organic light-emitting display panel of FIG. 2.

FIG. 6 is another example of the organic light-emitting display panel of FIG. 2.

The organic light-emitting display panel shown in FIG. 6 is the same as the organic light-emitting display panel shown in FIG. 3 except for a test unit 140B. The detailed descriptions of the same components are omitted below and only the different parts are mainly described.

Referring to FIG. 6, a pixel unit 110B has a structure in which a red pixel R and a blue pixel B are alternately arranged in the same column and green pixels G are arranged in a line in a column adjacent to a column in which the red pixel R ad the blue pixel B are arranged, like the pixel unit 110A shown in FIG. 3. The data lines D1 through Dm are arranged in each column.

The test unit 140B may include array test pads ATP, a signal distribution unit 150B and a test selection unit 160B between the array test pads ATP and the data pads DP of the IC mount area 130, and a cell test unit 170B.

For example, the signal distribution unit 150B within a sector 2000 includes first through sixth switches PSW1 through PSW6. The signal distribution unit 150B within the sector 2000 may couple a plurality of data pads DP1 through DP4 to one array test pad ATP through the first through sixth switches PSW1 through PSW6.

A first switch PSW1 and a second switch PSW2 are coupled through a first data pad DP1 to a first data line D1 of a first column Col1 in which first pixels and second pixels are alternately arranged, wherein the first and second pixels emit light with different colors. That is, the first switch PSW1 and the second switch PSW2 share one data line D1 and each is disposed in one of two current paths P1 and P2 which are connected in parallel. A third switch PSW3 and a sixth switch PSW6 are separately coupled through second and fourth data pads DP2 and DP4 to data lines D2 and D4 of second and fourth columns Col2 and Col4 in which third pixels are arranged, wherein the third pixels emit light with a color different from the first and second pixels. A fourth switch PSW4 and a fifth switch PSW5 are coupled through a third data pad DP3 to a third data line D3 of a third column Col3 in which the first pixels and the second pixels are alternately arranged. That is, the fourth switch PSW4 and the fifth switch PSW5 share one data line D3 and each is disposed in one of two current paths P3 and P4 which are connected in parallel.

The first switch PSW1 and the second switch PSW2 are coupled to the first data line D1 of the first column Col1 on which the first pixel and the second pixel are alternately arranged. The third switch PSW3 is coupled to the second data line D2 of the second column Col2 which is close to the first column and in which the third pixels are arranged. The fourth switch PSW4 and the fifth switch PSW5 are coupled to the third data line D3 of the third column Col3 which is close to the second column and in which the first pixel and the second pixel are alternately arranged in a line in an opposite order to the first column Col1. The sixth switch PSW6 is coupled to the fourth data line D4 of the fourth column Col4 which is close to the third column and in which the third pixels are arranged. More specifically, the second column Col2 is positioned between the first column Col1 and the third column Col3, and the fourth column Col4 is positioned adjacent to the third column Col3 and opposite to the second column Col2 with respect to the third column Col3. As shown in FIG. 6, the pixels of the first column Col1 through fourth column Col4, the data pads D1 through D4 that correspond to the first column Col1 through fourth column Col4, the switches PSW1 through PSW6 of the signal distribution unit 150B that correspond to the first column Col1 through fourth column Col4, are repetitively arranged in the second direction.

Thus, the first through the sixth switches PSW1 through PSW6 are 1:1 coupled to switches PSW91 through PSW96 of the cell test unit 170B. In addition, the second switch PSW2 coupled to the first data line D1 is coupled to the switch PSW92 through a seventh switch PSW7. That is, the second current path P2 including the second switch PSW2, the seventh switch PSW7, and the switch 92 is connected parallel to the first current path P1 including the first switch PSW1 and the switch PSW91. The fourth switch PSW4 coupled to the third data line D3 is coupled to the switch PSW94 through an eighth switch PSW8. That is, the third current path P3 including the fourth switch PSW4, the eighth switch PSW8, and the switch 94 is connected parallel to the fourth current path P4 including the fifth switch PSW5 and the switch PSW95. The gates of the first switch PSW1 and fourth switch PSW4 are coupled to a line 154a supplying a first control signal DC_GATE_R. The gate of the second switch PSW2 and fifth switch PSW5 are coupled to a line 154b supplying a second control signal DC_GATE_B. The gate of the third switch PSW3 is coupled to a line 154c supplying a third control signal DC_GATE_G1. The gate of the sixth switch PSW6 is coupled to a line 154d supplying a fourth control signal DC_GATE_G2.

The test selection unit 160A includes a plurality of switches PSW7 and PSW8 and a plurality of switches PSW10 through PSW12. The tenth switch PSW10 is coupled between a node between the first switch PSW1 and the switch PSW91 and a node between the third switch PSW3 and the switch PSW93. The eleventh switch PSW11 is coupled the node between the third switch PSW3 and the switch PSW93 and a node between the fifth switch PSW5 and the switch PSW95. The twelfth switch PSW12 is coupled between the node between the fifth switch PSW5 and the switch PSW95 and a node between the sixth switch PSW6 and the switch PSW96.

The gates of the switch PSW7 and PSW8 are coupled to a line 164a supplying a sixth control signal TEST_GATE of the cell test unit 170B and uses the sixth control signal TEST_GATE as a fifth control signal. The seventh switch PSW7 may be coupled to the second switch PSW2 coupled to the first data line D1 and the eighth switch PSW8 may be coupled to the fourth switch PSW4 coupled to the third data line D3. If the seventh and eighth switches PSW7 and PSW8 are turned on by the sixth control signal TEST_GATE, both the first switch PSW1 and the second switch PSW2 are coupled to the first data line D1, and both the fourth switch PSW4 and the fifth switch PSW5 are coupled to the third data line D3. If the seventh and eighth switches PSW7 and PSW8 are turned off by the sixth control signal TEST_GATE, the first switch PSW1 is coupled to the first data line D1 and the fifth switch PSW5 is coupled to the third data line D3. That is, the seventh switch PSW7 enables one or both of the first switch PSW1 and the second switch PSW2 to be coupled to the first data line D1 of the first column Col1 on which the first pixel and the second pixel are alternately arranged, and the eighth switch PSW8 enables one or both of the fourth switch PSW4 and the fifth switch PSW5 to be coupled to the third data line D3 of the third column Col3 on which the first pixel and the second pixel are alternately arranged in an order opposite to the first column Col1.

As shown in FIG. 6, the tenth switch PSW10 is coupled between the node between the first switch PSW1 and the switch PSW91 and the node between the third switch PSW3 and the switch PSW93. The eleventh switch PSW11 is coupled the node between the third switch PSW3 and the switch PSW93 and the node between the fifth switch PSW5 and the switch PSW95. The twelfth switch PSW12 is coupled between the node between the fifth switch PSW5 and the switch PSW95 and the node between the sixth switch PSW6 and the switch PSW96.

The gates of the tenth through twelfth switches PSW10 through PSW12 are coupled to the line 164b supplying the seventh control signal TEST_AT. If three switches PSW10 through PSW12 are turned on, the array test pad ATP may be electrically coupled to the data pads DP1 through DP4 coupled to the first through the fourth data lines D1 through D4 so that the array test S20 may be performed. If three seventh switches PSW10 through PSW12 are turned off, each of the first through the sixth switches PSW1 through PSW6 may be electrically coupled to one of the switches PSW91 through PSW96 so that the cell test S40 may be performed. That is, the tenth through twelfth switches PSW10 through PSW12 couples the signal distribution unit 150B to the array test pad ATP to enable the array test S20 to be performed or couples the signal distribution unit 150B to the cell test unit 170B to enable the cell test S40 to be performed.

The array test pad ATP receives an array test signal from a probe pin of an auto probe device, delivers the signal to the pixel unit 110B, and receives a test current output from the pixel unit 110B.

The cell test unit 170B includes a plurality of switches PSW91 through PSW96. The gates of the switches PSW91 through PSW96 are coupled to the line 174a supplying the sixth control signal TEST_GATE. One terminal of each of the switches PSW91 through PSW96 is coupled to one of the first through the sixth switches PSW1 PSW6, and another terminal of each of the switches PSW91 and PSW95 is coupled to a line 174c supplying a first cell test signal DC_R, another terminal of each of the switches PSW92 and PSW94 is coupled to a line 174d supplying a second cell test signal DC_B, and another terminal of each of the switches PSW93 and PSW96 is coupled to a line 174e supplying a third cell test signal DC_G.

The first to the third cell test signal lines 174c to 174e respectively receive direct current type cell test signals DC_R, DC_B, and DC_G from a pad unit 180 while the cell test S40 is performed.

The switches PSW91 through PSW96 receive the sixth control signal TEST_GATE to be used for maintaining a turned-on state during the cell test S40 and maintains the turned-on state in response thereto. Thus, the switch PSW91 supplies the first cell test signal DC_R to the first switch PSW1 coupled to the first data line D1, the switch PSW95 supplies the first cell test signal DC_R to the fifth switch PSW5 coupled to the third data line D3, the switch PSW92 supplies the second cell test signal DC_B to the second switch PSW2 coupled to the first data line D1, the switch PSW94 supplies the second cell test signal DC_B to the fourth switch PSW4 coupled to the third data line D3, the switch PSW93 supplies the third cell test signal DC_G to the third switch PSW3 coupled to the second data line D2, and the switch PSW96 supplies the third cell test signal DC_G to the sixth switch PSW6 coupled to the fourth data line D4. As shown in FIG. 6, the switches PSW91 through PSW96 of the cell test unit 170B that correspond to the first column Col1 through fourth column Col4, and the switches PSW7, PSW8, and PSW10 through PSW12 of the test selection unit 160B are repetitively arranged in the second direction. Meanwhile, the lines 164a and 164b, and the lines 174a through 174e extend in the second direction and couple to the gates of other switches of the test selection unit 160B and the cell test unit 170B.

The switches PSW91 through PSW96 receive the sixth control signal TEST_GATE to be used for maintaining a turned-off state during the array test S20 and maintain the turned-off state in response thereto.

Figure 7:
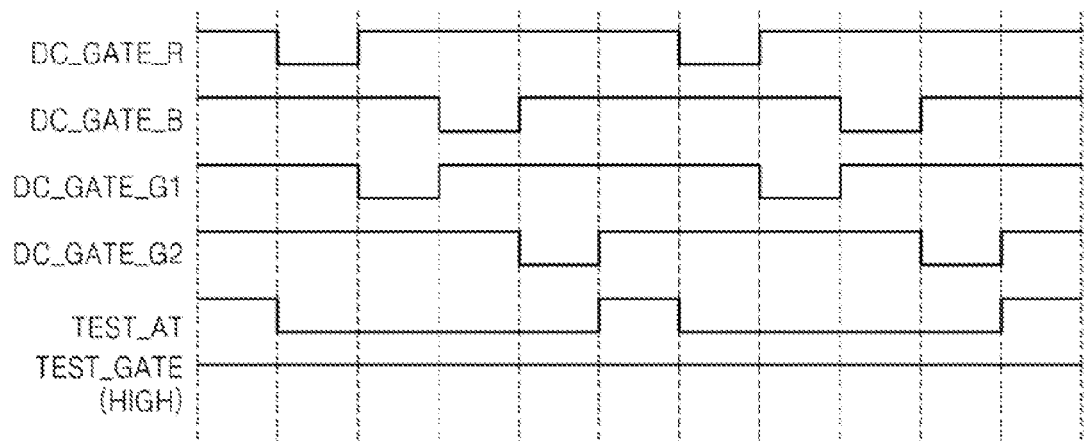
FIG. 7 is a timing diagram for explaining an array test for the organic light-emitting display panel of FIG. 6.

FIG. 7 is a timing diagram for explaining the array test of the organic light-emitting display panel of FIG. 6.

Referring to FIG. 7, during the array test S20, a high-level sixth control signal TEST_GATE is applied to the gates of the switches PSW91 through PSW96, and thus the switches PSW91 through PSW96 are turned off.

The high-level sixth control signal TEST_GATE is applied to the gates of the seventh and eighth switches PSW7 and PSW8, and thus the seventh and eighth switches PSW7 and PSW8 are turned off. Thus, one of the first switch PSW1 and the second switch PSW2 is electrically coupled to the first data line D1 of the first column Col1 in which the first pixel and the second pixel are alternately arranged and one of the fourth switch PSW4 and the fifth switch PSW5 is electrically coupled to the third data line D3 of the third column Col3 in which the first pixel and the second pixel are alternately arranged. For example, as shown in FIG. 6, the first switch PSW1 is electrically coupled to the first data line D1 and no current (or negligible current) passes through the second current path P2, the third switch PSW3 is electrically coupled to the second data line, the fifth switch PSW5 is electrically coupled to the third data line D3 and no current (or negligible current) passes through the third current path P3, and the sixth switch PSW6 is electrically coupled to the fourth data line D4, when a high-level sixth control signal TEST_GATE is applied to the gate of the seventh and eighth switches PSW7 and PSW8 of the test selection unit 160B.

A low-level seventh control signal TEST_AT is applied to the gates of the tenth through twelfth switches PSW10 through PSW12, and thus, the tenth through twelfth switches PSW10 through PSW12 are turned on. Thus, the array test pad ATP is coupled to the data pads DP1 through DP4 coupled to the first through the fourth data lines D1 through D4.

While the seventh and eighth switches PSW7 and PSW8 are in a turned-off state and the tenth through twelfth switches PSW10 through PSW12 are in a turned-on state, the first to the fourth control signals DC_GATE_R to DC_GATE_G2 are supplied, so the first through the sixth switches PSW1 through PSW6 are turned on in a determined order in response thereto. For example, the first control signal DC_GATE_R, the third control signal DC_GATE_G1, the second control signal DC_GATE_B, and the fourth control signal DC_GATE_G2 are sequentially applied the first switch PSW1 and fourth switch PSW4, the third switch PSW3, the second switch PSW2 and the fifth switch PSW5, and the sixth switch PSW6 are sequentially turned on in response thereto.

Thus, an array test signal supplied to the array test pad ATP through a probe pin of an auto probe device is supplied to the pixel unit 110B and a test current is output from the pixel unit 110B in response to the applied array test signal. The auto probe device may detect a defective pixel by sensing the test current from the array test pad ATP.

Figure 8:
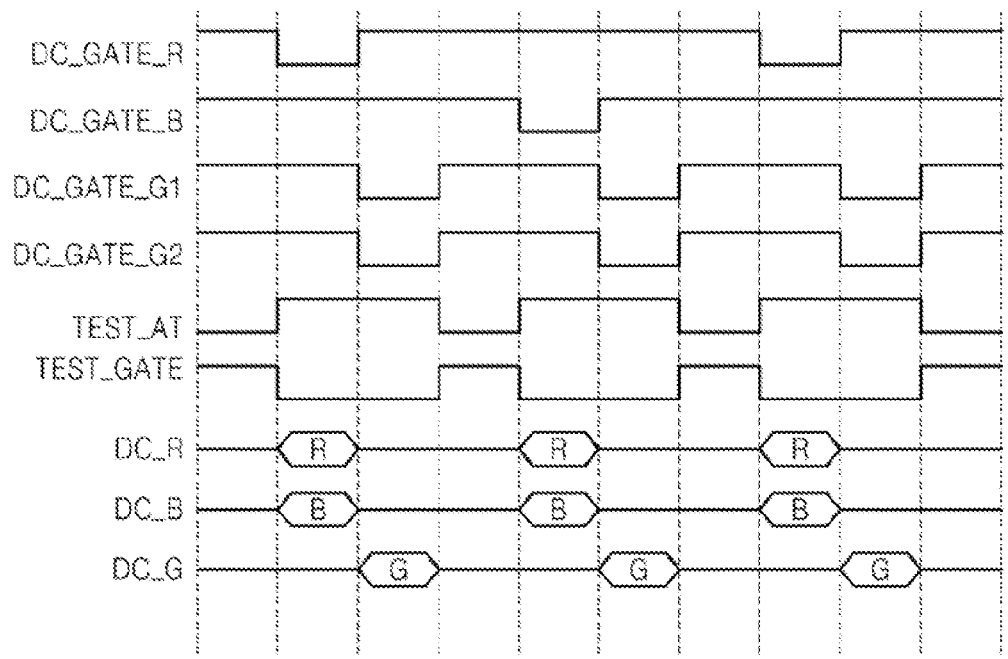
FIG. 8 is a timing diagram for explaining a cell test for the organic light-emitting display panel of FIG. 6.

FIG. 8 is a timing diagram for explaining the cell test for the organic light-emitting display panel of FIG. 6.

Referring to FIG. 8, during the cell test S40, a low-level sixth control signal TEST_GATE is applied to the gates of the switches PSW91 through PSW96, and thus, the switches PSW91 through PSW96 are turned on. The switches PSW7 and PSW8 are also turned on by the sixth control signal TEST_GATE. Thus, both the first switch PSW1 and the second switch PSW2 are coupled to the data line of a column in which a first pixel and a second pixel are alternately arranged, and both the fourth switch PSW4 and the fifth switch PSW5 are coupled to the data line of a column in which a first pixel and a second pixel are alternately arranged.

A high-level seventh control signal TEST_AT is applied to the gates of the tenth through twelfth switches PSW10 through PSW12, the tenth through twelfth switches PSW10 through PSW12 are turned off. Thus, the first switch PSW1 through the sixth switch PSW6 are connected to the switches PSW91 through PSW96 of the cell test unit 170B, respectively.

While the tenth through twelfth switches PSW10 and PSW12 are in a turned-on state and the tenth through twelfth switches PSW10 through PSW12 are in a turned-off state, the first through the fourth control signals DC_GATE_R to DC_GATE_G2 are supplied in a determined order and thus the first through the sixth switches PSW1 through PSW6 are turned on in a determined order in response thereto. For example, during odd frames, the first control signal DC_GATE_R is applied and subsequently the third control signal DC_GATE_G1 and the fourth control signal DC_GATE_G2 are simultaneously applied. In response thereto, the first switch PSW1 and the fourth switch PSW4 are turned on and subsequently the third switch PSW3 and the sixth switch PSW6 are simultaneously turned on. During even frames, the second control signal DC_GATE_B is applied and subsequently the third control signal DC_GATE_G1 and the fourth control signal DC_GATE_G2 are simultaneously applied. In response thereto, the second switch PSW2 and the fifth switch PSW5 are turned on and subsequently the third switch PSW3 and the sixth switch PSW6 are simultaneously turned on.

During odd frames, while the seventh and eighth switches PSW7 and PSW8 are in a turned-on state and the tenth through twelfth switches PSW10 and PSW12 are in a turned-off state, the first control signal DC_GATE_R is applied and the first and the fourth switches PSW1 and PSW4 are turned on. Thus, the first cell test signal DC_R is applied to the first data line D1 of the first column Col1 in which the first pixel and the second pixel are alternately arranged, and the second cell test signal DC_B is applied to the third data line D3 of the third column Col3 in which the first pixel and the second pixel are alternately arranged in an opposite order to the first column Col1. Subsequently, the third control signal DC_GATE_G1 and the fourth control signal DC_GATE_G2 are simultaneously applied and thus the third switch PSW3 and the sixth switch PSW6 are simultaneously turned on. Thus, the third cell test signal DC_G is applied to the second and the fourth data lines D2 and D4 of the second column Col2 and the fourth column Col4 in which the third pixels are arranged.

During even frames, while the seventh and eighth switches PSW7 and PSW8 are in a turned-on state and the tenth through twelfth switches PSW10 through PSW12 are in a turned-off state, the second control signal DC_GATE_B is applied and thus the second and fifth switches PSW2 and PSW5 are turned on. Thus, the second cell test signal DC_B is applied to the first data line D1 of the first column Col1 on which the first pixel and the second pixel are alternately arranged, and the first cell test signal DC_R is applied to the third data line D3 of the third column Col3 in which the first pixel and the second pixel are alternately arranged in an opposite order to the first column Col1. Subsequently, the third control signal DC_GATE_G1 and the fourth control signal DC_GATE_G2 are simultaneously applied and thus the third switch PSW3 and the sixth switch PSW6 are simultaneously turned on. Thus, the third cell test signal DC_G is applied to the second and the fourth data lines D2 and D4 of the second column Col2 and the fourth column Col4 in which the third pixels are arranged.

Thus, the first to the third pixels of the pixel unit 110B emit light by using the first to the third cell test signals TEST_DATA_R, TEST_DATA_B, and TEST_DATA_G so that the cell test, such as a lighting test, may be performed.

Figure 9:
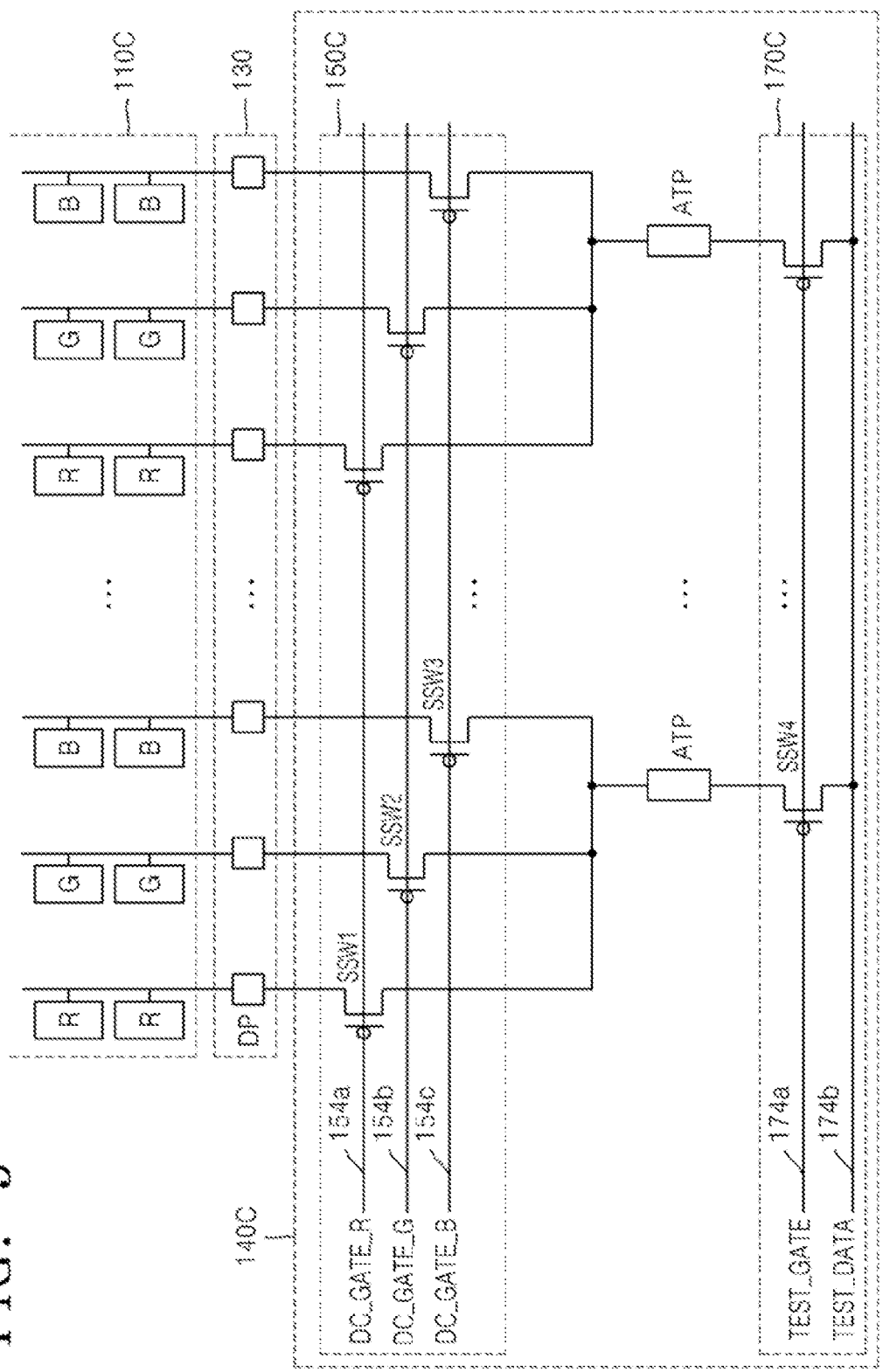
FIG. 9 is a plan view of an example of the organic light-emitting display panel of FIG. 2.

FIG. 9 is a plan view of an example of the organic light-emitting display panel of FIG. 2.

Referring to FIG. 9, a pixel unit 110C includes first pixels, second pixels, and third pixels that emit light of different colors, and has a structure in which the first pixels to the third pixels are respectively arranged in adjacent columns in a line.

The first pixel may be a red pixel R emitting a red light, the second pixel may be a green pixel G emitting a green light, and the third pixel may be a blue pixel B emitting a blue light.

The green pixels R, the green pixels G, and the blue pixels B are arranged in respective columns in a line. Data lines are arranged in each column.

Although according to the embodiment of the present invention the pixel unit 110C includes the red pixel R, the blue pixel B, and the green pixel G, the pixel unit 110C may further include other pixels (not shown) for displaying colors other than the red color, the green color, and the blue color.

A test unit 140C may include array test pads ATP, a signal distribution unit 150C between array test pads ATP and the data pads DP of an IC mount area 130, and a cell test unit 170C.

Lines supplying signals from a pad unit 180 to the signal distribution unit 150C may include three lines 154a to 154c that receive first to third control signals DC_GATE_R, DC_GATE_G, and DC_GATE_B.

The signal distribution unit 150C includes first to third switches SSW1 to SSW3. The signal distribution unit 150C may couple a plurality of data pads DP to one array test pad ATP through the first to third switches SSW1 to SSW3. Thus, by making the number of the array test pads ATP smaller than the number of the data pads DP, it is possible to increase the size of the array test pads ATP and the interval between the array test pads ATP. Since in the embodiment of FIG. 9, three data pads DP are coupled to one array test pad ATP, it is possible to decrease the number of the array test pads ATP to ⅓ times the number of data pads DP.

The first switch SSW1 is coupled through the data pad DP to a first data line of a first column in which the first pixels are arranged. The second switch SSW2 is coupled through the data pad DP to a second data line of a second column in which the second pixels are arranged. The third switch SSW3 is coupled through the data pad DP to a third data line of a third column in which the third pixels are arranged. The first column to the third column are repetitively arranged in a second direction. The first switch SSW1 to the third switch SSW3 is coupled to one array test pad ATP.

The gate of the first switch SSW1 is coupled to a line 154a supplying a first control signal DC_GATE_R. The gate of the second switch SSW2 is coupled to a line 154b supplying a second control signal DC_GATE_G. The gate of the third switch SSW3 is coupled to a line 154c supplying a third control signal DC_GATE_B.

The first to the third control signal lines 154a to 154c receive direct current type control signals DC_GATE_R, DC_GATE_G, and DC_GATE_B respectively from the pad unit 180 while an array test S20 and a cell test S40 are performed, and control the turning on and the turning off of the first to the third switches SSW1 to SSW3.

The array test pad ATP is in contact with (coupled to) a probe pin of an auto probe device. Since the data pad DP is small in size and the interval between data pads DP is narrow, the data pad DP may not make 1:1 contact with the probe pin of the auto probe device. On the contrary, the array test pad ATP according to the embodiment of the present invention uses a plurality of switches SSW1 to SSW3 and thus may have a large size and interval. That is, since the array test pad ATP may make 1:1 contact with the probe pin of the auto probe device, it is possible to perform the array test S20. The array test pad ATP receives an array test signal AT_DATA from the probe pin of the auto probe device, delivers the signal to the pixel unit 110C, and receives a test current output from the pixel unit 110C.

A line supplying a signal from the pad unit 180 to the cell test unit 170C may include two lines that are a line 174a receiving a fourth control signal TEST_GATE, and a line 174b receiving a cell test signal TEST_DATA.

The cell test unit 170C includes a plurality of fourth switches SSW4. The gate of the fourth switch SSW4 is coupled to the line 174a supplying the fourth control signal TEST_GATE. The first terminal of the fourth switch SSW4 is coupled to the array test pad ATP and the second terminal thereof is coupled to the line 174b supplying the cell test signal TEST_DATA. The fourth switch SSW4 receives the fourth control signal TEST_GATE to be used for maintaining a turned-off state during the array test S20 and maintains the turned-off state in response thereto. The fourth switch SSW4 receives the fourth control signal TEST_GATE to be used for maintaining a turned-on state during the cell test S40 and maintains the turned-on state in response thereto. The cell test signals TEST_DATA are signals that sequentially apply first to third cell test signals.

Figure 10:
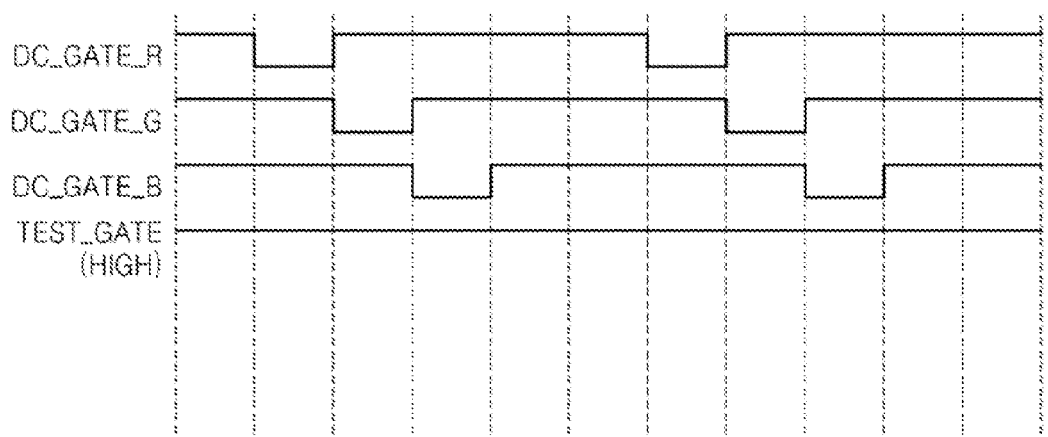
FIG. 10 is a timing diagram for explaining an array test for the organic light-emitting display panel of FIG. 9.

FIG. 10 is a timing diagram for explaining the array test of the organic light-emitting display panel of FIG. 9.

Referring to FIG. 10, during the array test S20, a high-level fourth control signal TEST_GATE is applied to the gates of the fourth switches SSW4 which are thus turned off.

While the fourth switches SSW4 are in a turned-off state, the first to the third control signals DC_GATE_R to DC_GATE_B are supplied in a determined order, so the first to the fourth switches SSW1 to SSW3 are turned on in a determined order in response thereto. For example, the first control signal DC_GATE_R, the second control signal DC_GATE_G, and the third control signal DC_GATE_B are sequentially applied and the first switch SSW1, the second switch SSW2, and the third switch PSW3 are sequentially turned on in response thereto.

Thus, an array test signal AT_DATA supplied to the array test pad ATP through a probe pin of an auto probe device is supplied to the pixel unit 110C and a test current is output in response to the applied array test signal AT_DATA. The auto probe device may detect a defective pixel by sensing the test current from the array test pad ATP.

Figure 11:
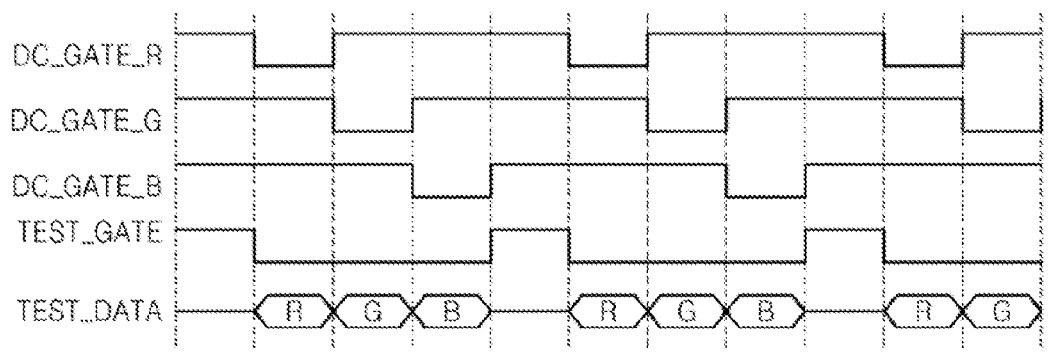
FIG. 11 is a timing diagram for explaining a cell test for the organic light-emitting display panel of FIG. 9.

FIG. 11 is a timing diagram for explaining the cell test of the organic light-emitting display panel of FIG. 9.

Referring to FIG. 11, during the cell test S40, a low-level fourth control signal TEST_GATE is applied to the gates of the fourth switches SSW4 which are thus turned on.

While the fourth switches SSW4 are in a turned-on state, the first control signal DC_GATE_R, the second control signal DC_GATE_G, and the third control signal DC_GATE_B are sequentially applied and thus the first switch SSW1, the second switch SSW2, and the third switch SSW3 are sequentially turned on. In addition, the first to the third cell test signals TEST_DATA_R to TEST_DATA_B are sequentially applied to the signal line 174b. Thus, the first to the third cell test signals TEST_DATA_R to TEST_DATA_B are sequentially applied to the first to the third data lines.

Thus, the first to the third pixels of the pixel unit 110C emit light by using the first to the third cell test signals TEST_DATA_R, TEST_DATA_G, and TEST_DATA_B so that the cell test, such as a lighting test, may be performed.

Figure 12:
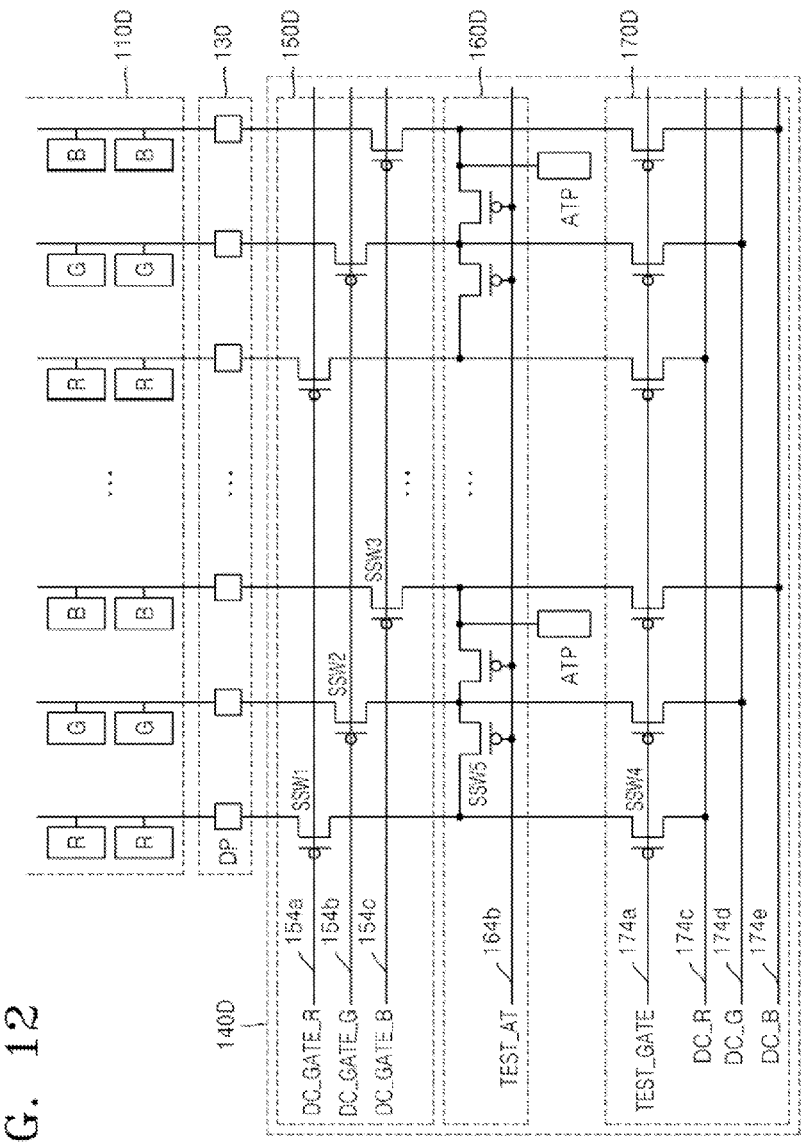
FIG. 12 is a plan view of an example of the organic light-emitting display panel of FIG. 2.

FIG. 12 is an example of the organic light-emitting display panel of FIG. 2.

The organic light-emitting display panel of FIG. 12 has the same components as the organic light-emitting display panel of FIG. 9, excluding a test unit 140D. The detailed descriptions of the same components are omitted below and only different parts are mainly described.

Referring to FIG. 12, a pixel unit 110D has a structure in which red pixels R, green pixels G, and blue pixels B are arranged in respective columns in a line, like the pixel unit 110C of FIG. 9. Data lines are arranged in each column.

The test unit 140D may include array test pads ATP, a signal distribution unit 150D and a test selection unit 160D between the array test pads ATP and the data pads DP of an IC mount area 130, and a cell test unit 170D.

The signal distribution unit 150D includes first to third switches SSW1 to SSW3. The signal distribution unit 150D may couple a plurality of data pads DP to one array test pad ATP through the first to the third switches SSW1 to SSW3.

The first switch SSW1 is coupled through the data pad DP to a first data line of a first column on which first pixels are arranged. The second switch SSW2 is coupled through the data pad DP to a second data line of a second column on which second pixels are arranged. The third switch SSW3 is coupled through the data pad DP to a third data line of a third column on which third pixels are arranged. The first column to the third column are repetitively arranged in a second direction.

The first to the third switches SSW1 to SSW3 are 1:1 coupled to a fourth switch SSW4 of the cell test unit 170D. The gate of the first switch SSW1 is coupled to a line 154a supplying a first control signal DC_GATE_R. The gate of the second switch SSW2 is coupled to a line 154b supplying a second control signal DC_GATE_G. The gate of the third switch SSW3 is coupled to a line 154c supplying a third control signal DC_GATE_B.

The test selection unit 160D includes a plurality of fifth switches SSW5. The fifth switches SSW5 are coupled among the first switch SSW1, the second switch SSW2, and the third switch SSW3. For example, the fifth switches SSW5 are respectively arranged between the first switch SSW1 coupled to the first data line and the second switch SSW2 coupled to the second data line, between the second switch SSW2 coupled to the second data line and the third switch SSW3 coupled to the third data line to couple the first to the third switches SSW1 to SSW3. In addition, two switches SSW5 are coupled to the array test pad ATP.

The gates of the fifth switch SSW5 are coupled to a line 164b supplying a fifth control signal TEST_AT. If two fifth switches SSW5 are turned on, the array test pad ATP is coupled to the data pads DP coupled to the first to the third data lines so that the array test S20 may be performed. If two fifth switches SSW5 are turned off, each of the first to the third switches SSW1 to SSW3 is coupled to a fourth switch SSW4 so that the cell test S40 may be performed. That is, the fifth switch SSW5 couples the signal distribution unit 150D to the array test pad ATP to enable the array test S20 to be performed or couples the signal distribution unit 150D to the cell test unit 170D to enable the cell test S40 to be performed.

The array test pad ATP receives an array test signal from a probe pin of an auto probe device, delivers the signal to the pixel unit 110D, and receives a test current output from the pixel unit 110D.

The cell test unit 170D includes a plurality of fourth switches SSW4. The gate of the fourth switch SSW4 is coupled to a line 174a supplying a fourth control signal TEST_GATE. The first terminal of the fourth switch SSW4 is coupled to one of the first to the third switches SSW1 to SSW3, and the second terminal of thereof is coupled to one of lines 174c to 174e supplying first to third cell test signals DC_R, DC_G, and DC_B.

The first to the third cell test signal lines 174c to 174e receive direct current type cell test signals DC_R, DC_G, and DC_B respectively from a pad unit 180 while the cell test S40 is performed.

The fourth switches SSW4 receive the fourth control signal TEST_GATE to be used for maintaining a turned-on state during the cell test S20 and maintains the turned-on state in response thereto. Thus, the fourth switch SSW4 may supply the first cell test signal DC_R to the first data line through the first switch SSW1, supply the second cell test signal DC_G to the second data line through the second switch SSW2, and supply the third cell test signal DC_B to the third data line through the third switch SSW3.

The fourth switches SSW4 receive the fourth control signal TEST_GATE to be used for maintaining a turned-off state during the array test S20 and maintains the turned-off state in response thereto.

Figure 13:
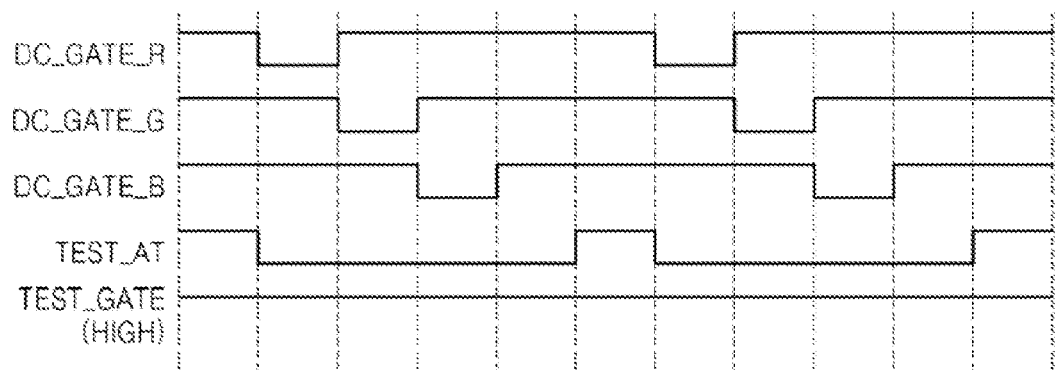
FIG. 13 is a timing diagram for explaining an array test for the organic light-emitting display panel of FIG. 12.

FIG. 13 is a timing diagram for explaining the array test of the organic light-emitting display panel of FIG. 12.

Referring to FIG. 13, during the array test S20, a high-level fourth control signal TEST_GATE is applied to the gates of the fourth switches SSW4 which are thus turned off.

A low-level fifth control signal TEST_AT is applied to the gates of the fifth switches SSW5 which are thus turned on. Thus, the array test pad ATP is coupled to the data pads DP coupled to the first to the third data lines.

While the fifth switches SSW5 are in a turned-on state, the first to the third control signals DC_GATE_R, DC_GATE_G, and DC_GATE_B are supplied in a determined order, so the first to the third switches SSW1 to SSW3 are turned on in a determined order in response thereto. For example, the first control signal DC_GATE_R, the second control signal DC_GATE_G, and the third control signal DC_GATE_B are sequentially applied and the first switch SSW1, the second switch SSW2, and the third switch SSW3 are sequentially turned on in response thereto.

Thus, an array test signal supplied to the array test pad ATP through a probe pin of an auto probe device is supplied to the pixel unit 110D and a test current is output from the pixel unit 110D in response to the applied array test signal. The auto probe device may detect a defective pixel by sensing the test current from the array test pad ATP.

Figure 14:
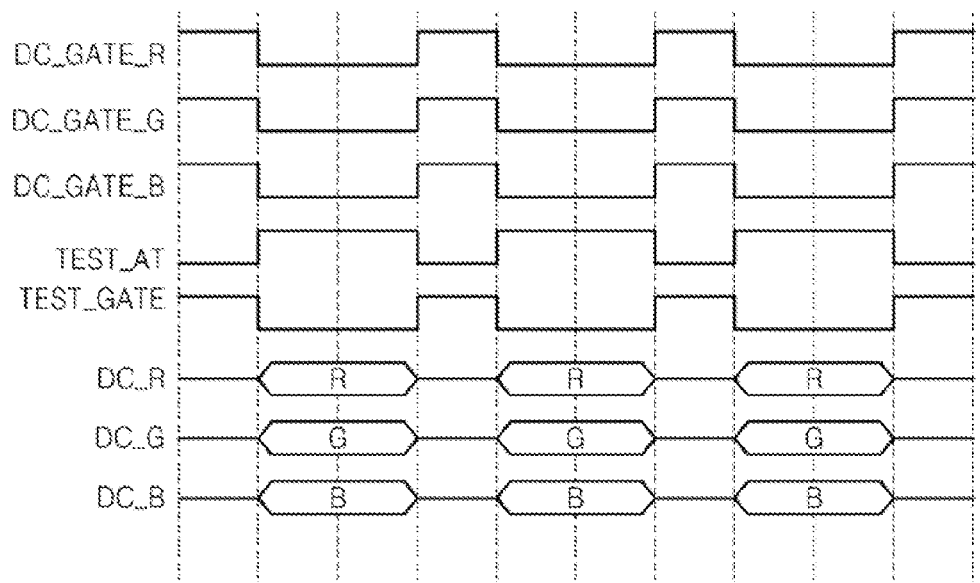
FIG. 14 is a timing diagram for explaining a cell test for the organic light-emitting display panel of FIG. 12.

FIG. 14 is a timing diagram for explaining the cell test of the organic light-emitting display panel of FIG. 12.

Referring to FIG. 14, during the cell test S40, a low-level fourth control signal TEST_GATE is applied to the gates of the fourth switches SSW4 which are thus turned on.

A high-level fifth control signal TEST_AT is applied to the gates of the fifth switches SSW5 which are thus turned off. Thus, the first to the third switches SSW1 to SSW3 are respectively coupled to the fourth switches SSW4 of the cell test unit 170D.

While the fourth switches SSW4 are in a turned-on state and the fifth switches SSW5 are in a turned-off state, the first to the third control signals DC_GATE_R, DC_GATE_G, and DC_GATE_B are supplied in a determined order and thus the first to the third switches SSW1 to SSW3 are turned-on in a determined order in response thereto. For example, the first control DC_GATE_R, the second control signal DC_GATE_G, and the third control signal DC_GATE_B are simultaneously applied and the first switch SSW1, the second switch SSW2, and the third switch SSW3 are simultaneously turned on in response thereto. Thus, the first to the third cell test signals DC_R, DC_G, and DC_B are simultaneously applied to the first to the third data lines.

Thus, the first to the third pixels of the pixel unit 110D emit light by using the first to the third cell test signals DC_R, DC_G, and DC_B so that the cell test, such as a lighting test, may be performed.

Although according to FIG. 14 the first to the third control signals DC_GATE_R, DC_GATE_G, and DC_GATE_B are simultaneously supplied, the present invention is not limited thereto and the first control signal DC_GATE_R, the second control signal DC_GATE_G, and the third control signal DC_GATE_B may be sequentially applied and the first switch SSW1, the second switch SSW2, and the third switch SSW3 are sequentially turned on in response thereto so that the first to the third cell test signals DC_R, DC_G, and DC_B may be sequentially applied to the first to the third data lines.

As a display apparatus needs a higher resolution, the number of pixels and the number of data lines has been increased, and thus, the number of data pads DP has been increased too. Consequently, as the size of the data pad DP has become smaller and the interval between data pads DP, namely, a pitch therebetween, has become narrower, the probe pin of the auto probe device may not make 1:1 contact with the data pad DP. Accordingly, the organic light-emitting display panel 100 according to the embodiments of the present invention includes a de-multiplexer in the test unit 140, thereby coupling two or more data pads DP to one array test pad ATP. Thus, by decreasing the number of the array test pads ATP and enlarging the size of the array test pad ATP compared to the data pad DP, it is possible to form an array test pad ATD having a sufficient size and also increase the pitch between the array test pads ATP. Thus, since it is possible to make a 1:1 contact between the probe pin of the auto probe device and the array test pad ATP and increase a contact accuracy, it is possible to perform an array test.

Also, since the organic light-emitting display panel 100 according to the embodiments of the present invention includes a test circuit unit that may selectively perform an array test and a cell test, it is possible to easily perform the array test and the cell test. In addition, since there is no need to separately include test circuits, it is possible to minimize a non-display area.

Although according to the embodiments of the present invention the switches PSW1 to PSW7 and SSW1 to SSW5 are PMOS type transistors, the present invention is not limited thereto and the switches PSW1 to PSW7 and SSW1 to SSW5 may be NMOS type transistors or transistors of other types and the signal levels for turning on/off transistors may vary accordingly.

According to the present invention, since a complex circuit unit that may perform both an array test and a cell test is formed under a COG mounting area, it is possible to easily perform the array test and the cell test and thus detect early a defect of a pixel. Also, it is possible to reduce a non-display area and thus provide a slim panel.

While the specification describes several embodiments of the present invention, other various embodiments may be made within the scope of the present invention. In addition, although equivalent means to achieve the embodiments of the present invention are not specifically described in the specification, they are also included in the present invention. Thus, the true protective scope of the present invention is defined by the following claims.

What is claimed is:

1. An organic light-emitting display panel, comprising:
   a pixel unit including a plurality of first, second, and third pixels, each pixel located at intersections of scan lines and data lines and including a light-emitting device and a pixel circuit coupled to said light-emitting device;
   a plurality of data pads respectively coupled to ends of the data lines; and
   a test unit, which is coupled to the pixel unit via the plurality of data pads, selectively performing an array test to detect a defect of the pixel circuits of the pixels or a cell test to detect a defect of the light-emitting devices of the pixels.

2. The organic light-emitting display panel of claim 1, wherein the pixel unit comprises:
   a first column in which the first pixels and the second pixels are alternately arranged;
   a second column and a fourth column, in which the third pixels are arranged, the second column interposed between the first column and the fourth column; and
   a third column, in which the first pixels and the second pixels are alternately arranged in an opposite order to the first column, the third column interposed between the second column and the fourth column.

3. The organic light-emitting display panel of claim 2, wherein the test unit comprises:
   an array test pad externally receiving array test signals, delivering the signals to the pixel unit, and receiving test currents output from the pixel unit;
   a signal distribution unit arranged between the data pads and the array test pad, and comprising
      a first switch positioned in a first current path and a second switch positioned in a second current path that are coupled to a first data line arranged in the first column,
      a fourth switch positioned in a third current path and a fifth switch positioned in a fourth current path that are coupled to a third data line arranged in the third column,
      a third switch coupled to a second data line arranged in the second column, and
      a sixth switch coupled to a fourth data line arranged in the fourth column,
      the first and second current paths connected in parallel, the third and fourth current paths connected in parallel;
   a test selection unit comprising a seventh switch that is positioned in the second current path and an eighth switch that is positioned in the third current path; and
   a cell test unit comprising a ninth switch delivering a cell test signal to the pixel unit.

4. The organic light-emitting display panel of claim 3, wherein the array test pad is interposed between the ninth switch and the test selection unit.

5. The organic light-emitting display panel of claim 4, wherein during the array test, the ninth switch maintains a turned-off state,
   the seventh switch is turned-off, blocking a current passing through the second current path, and the eighth switch is turned-off, blocking a current passing through the third current path, and
   the first and fourth switches, the second and fifth switches, the third switch, and the sixth switch are turned off in a determined order and deliver the array test signal to the pixel unit.

6. The organic light-emitting display panel of claim 4, wherein during the cell test, the ninth switch maintains a turned-on state,
   if the seventh and eighth switches are turned off, the first switch is electrically coupled to the first data line arranged in the first column and the fifth switch is electrically coupled to the third data line arranged in the third column, and the first switch and the fifth switch are turned on in a determined order and delivers first and second cell test signals to the pixel unit, and
   if the seventh and eighth switches are turned on, the third switch and the sixth switch are simultaneously turned on and deliver a third cell test signal to the pixel unit.

7. The organic light-emitting display panel of claim 3, wherein the test selection unit further comprises a plurality of switches that are arranged among the first, third, fifth, and sixth switches, and couple the first, third, fifth, and sixth switches to the array test pad.

8. The organic light-emitting display panel of claim 7, wherein the ninth switch is formed of a plurality of sub-switches each coupled to one of the first through sixth switches and delivers one of the first to the third cell test signals to the pixel unit.

9. The organic light-emitting display panel of claim 8, wherein during the array test, the plurality of sub-switches maintain a turned-off state,
   the seventh and eighth switches are turned off, blocking a current flowing through any of the second and third current paths,
   the plurality of switches of the test selection unit that are arranged among the first, third, fifth, and sixth switches are turned on and couple the first, third, fifth, and sixth switches to the array test pad, and
   the first, third, fifth, and sixth switches are turned on in a determined order and deliver the array test signal to the pixel unit.

10. The organic light-emitting display panel of claim 8, wherein during the cell test, the plurality of sub-switches maintain a turned-on state,
   the seventh and eighth switches are turned on, and electrically couple both the first switch and the second switch to the first data line arranged in the first column and electrically couple both the fourth switch and the fifth switch to the third data line arranged in the third column, the plurality of switches of the test selection unit that are arranged among the first, third, fifth, and sixth switches are turned off, the first through sixth switches are coupled to the ninth switch, and the first and fourth switches, the second and fifth switches, the third switch, and the sixth switch are turned on in a determined order and deliver the first to the third cell test signals to the pixel unit.

11. The organic light-emitting display panel of claim 8, wherein the first to the third cell test signals are direct-current signals.

12. The organic light-emitting display panel of claim 1, wherein the pixel unit comprises:
   a first column on which the first pixels are arranged;
   a third column in which the third pixels are arranged; and
   a second column, in which the second pixels are arranged, interposed between the first and second columns.

13. The organic light-emitting display panel of claim 12, wherein the test unit comprises:
   an array test pad externally receiving an array test signal, delivering the signal to the pixel unit, and receiving a test current output from the pixel unit;
   a signal distribution unit arranged between the data pads and the array test pads and comprising first through third switches each coupled to a data line arranged in each of the first through third columns; and
   a cell test unit comprising a fourth switch delivering a cell test signal to the pixel unit.

14. The organic light-emitting display panel of claim 13, wherein the array test pad is disposed between the fourth switch and the signal distribution unit.

15. The organic light-emitting display panel of claim 14, wherein during the array test, the fourth switch maintains a turned-off state, and the first through third switches are turned on in a determined order and deliver the array test signal to the pixel unit.

16. The organic light-emitting display panel of claim 14, wherein during the cell test, the fourth switch maintains a turned-on state, and the first through third switches are turned on in a determined order and deliver first to third cell test signals to the pixel unit.

17. The organic light-emitting display panel of claim 13, further comprising a test selection unit that comprises fifth switches arranged among the first through third switches and coupling the first through third switches to the array test pad.

18. The organic light-emitting display panel of claim 17, wherein the fourth switch comprises a plurality of sub-switches each coupled to one of the first through third switches and delivers one of the first to the third cell test signals to the pixel unit.

19. The organic light-emitting display panel of claim 18, wherein during the array test, the plurality of sub-switches maintain a turned-off state, the fifth switches are turned on and couple the first through third switches to the array test pad, and the first through third switches are turned on in a determined order and deliver the array test signal to the pixel unit.

20. The organic light-emitting display panel of claim 18, wherein during the cell test, the plurality of sub-switches maintain a turned-on state, the fifth switches are turned off, and the first through third switches are turned on in a determined order and deliver the first to the third cell test signals to the pixel unit.

* * * * *